United States Patent
Dodonov et al.

(10) Patent No.: US 6,635,156 B1
(45) Date of Patent: Oct. 21, 2003

(54) PRODUCING ELECTRIC ARC PLASMA IN A CURVILINEAR PLASMAGUIDE AND SUBSTRATE COATING

(75) Inventors: Alexander Igorevich Dodonov, Istra (RU); Valery Mikhaylovich Bashkov, Moskva (RU)

(73) Assignee: V.I.P.-Vacuum Ion Plasma Technologies Ltd., Kazrin (IL)

( * ) Notice: Subject to any disclaimer, the term of this patent is extended or adjusted under 35 U.S.C. 154(b) by 0 days.

(21) Appl. No.: 09/381,971

(22) Filed: Oct. 4, 1999

(51) Int. Cl.$^7$ .............................................. C23C 14/32
(52) U.S. Cl. ............................. 204/192.38; 204/298.41
(58) Field of Search ....................... 204/192.38, 298.41; 118/723 VE

(56) References Cited

U.S. PATENT DOCUMENTS

| | | | | |
|---|---|---|---|---|
| 5,279,723 A | * | 1/1994 | Falabella et al. | 204/192.38 |
| 5,282,944 A | * | 2/1994 | Sanders et al. | 204/192.38 |
| 5,433,836 A | | 7/1995 | Martin et al. | 204/298.4 |
| 6,026,763 A | * | 2/2000 | Kim et al. | 118/723 HC |
| 6,031,239 A | * | 2/2000 | Shi et al. | 250/492.21 |

OTHER PUBLICATIONS

Sanders, J. Vac. Sci. Technology A, vol. 7, No. 3, "Review of ion–based coating . . .", pp. 2339–2345, May/Jun. 1989.
Aksenov et al, Sov. J. Plasma Phys., vol. 4, No. 4, "Transport of Plasma streams . . . ", pp. 425–428, Jul./Aug. 1978.
Zhitomirsky et al, J. Vac. Sci. Technol. A, vol. 13, No. 4, "Unstable arc operation . . . ", pp. 2233–2240, Jul./Aug. 1995.
Zhitomirsky et al, Surface and Coatings Technology, vol. 86, No. 37, "Influence of gas . . . ", pp. 263–270, 1996.
Zhitomirsky et al, Surface and Coatings Technology, vol. 76, No. 77, "Ion current . . . ", pp. 190–196, 1995.

* cited by examiner

Primary Examiner—Rodney G. McDonald
(74) Attorney, Agent, or Firm—Jacobson Holman PLLC

(57) ABSTRACT

The present invention relates to a method and apparatus for producing electric arc plasma and for use thereof for deposition coatings on a substrate. Electric arc separated plasma is produced using electric arc discharge on a cold cathode by passing it through a curvilinear plasmaguide. Said plasma is created within the curvilinear plasmaguide and electric current is put through it in a longitudinal direction forming length-uniform magnetic field whereby allowing a high-quality coating to be deposited on the substrate using sputtering.

11 Claims, 1 Drawing Sheet

PRODUCING ELECTRIC ARC PLASMA IN A CURVILINEAR PLASMAGUIDE AND SUBSTRATE COATING

FIELD OF TECHNOLOGY

The present invention is directed to a method and apparatus for producing electric arc plasma and use thereof for coating a substrate. During the last decades, electric arc plasma sources have been increasingly utilised in industry for depositing on articles coatings based on metals, their alloys and compositions. They are used to coat machine parts, tools, consumer goods, etc., with wear-resistant, corrosion-resistant, decorative coatings, coatings with desirable electric and magnetic characteristics, and other coatings having special properties. Further, vacuum arc plasma sources are employed for producing ion beams used for ion implantation, in ionic accelerators as well as in rocket power units.

PRIOR ART

The process for producing plasmic flux in a vacuum electric arc source consists in the following. A high-current arc discharge is ignited in vacuum on cooled cathode made of material on the base of which a coating is to be produced. Generally, arc discharge ignition is carried out either by mechanical breaking of electric contact between the cathode and a special electrode or by use of high-voltage or laser spark. Arc discharge on the cold cathode is concentrates into cathode spots sized from several microns to hundreds microns and current densities therein of up to $10^6$–$10^8$ A/sq. cm. Each spot emits a metallic plasma jet in a direction approximately perpendicular to the cathode surface. In the absence of magnetic and electric fields, the cathode spots move chaotically over the cathode surface. Using electric and magnetic fields, it is possible to control spot movement retaining them on the working surface and forcing to move according to desired paths.

Each spot appropriately contributes to the plasma flux which has distribution close to cosinusoidal with the axis perpendicular to the cathode surface. Due to specific features of vacuum arc burning on the cold cathode, in particular, due to creation near the cathode of a positive volume charge., plasma ions are accelerated to energies from several units to hundreds of electron-volts in a direction perpendicular to the cathode surface.

The plasma flux produced in the electric arc source is highly ionised. Ionisation level for a number of materials approaches 100%. Plasma contains a considerable quantity of two- or three-fold ionised particles. This is a substantial benefit over sources based on effects of spraying (including magnetron) and evaporation (by electronic beam, laser radiation, etc.) of material where material flows have a low ionisation level. A high ionisation level allows the flux to be controlled using electro-magnetic fields, enables to check and control the energy of atoms coming to the substrate and enhances the evaporated material reactivity in forming compounds both with reaction gas and directly with the material of the substrate to be coated.

In order to deposit coatings, the plasma flux is directed on the substrate to which generally accelerating voltage is applied to produce the desired energy of surface impinging ions. In general, the process for depositing coatings comprises two steps. In the first step, at a sufficiently high vacuum (at a pressure of $10^4$ mm Hg and lower) accelerating voltage as high as 1000–1500 volts is applied to the substrate. Cathode material ions are accelerated near the substrate in the Debaye layer and bombard its surface. During ion bombardment, surface cleaning from impurities, the so-called "ionic bombardment cleaning", takes place. After conducting "ionic cleaning", the voltage applied to the substrate is reduced to several dozens to several hundreds volts and surface impinging particles condense on its surface forming a coating corresponding to the cathode material. In order to produce composite coatings, reaction gas is introduced in working chamber, generally, to pressures of $10^{-2}$–$10^{-4}$ mm Hg. In this case, it is possible to produce coatings based on cathode material/reaction gas compositions.

The problem with electric arc plasma sources is that the arc discharge generates, along with a vapour component, drops of the surface molten material, i.e. particulates. Such particulates have characteristic sizes from fractions of micron to dozens of microns. Particulates can hit the substrate to be coated forming irregularities in the coat structure and defects in form of indents and protrusions. This effect considerably decreases applications of electric arc plasma sources. The presence of particulates in the plasma flux prevents from depositing coatings on parts with high grade of surface cleanness, on sharply whetted tools, and reduces considerably operating characteristics of coatings such as wear-resistance, electric and magnetic properties.

Furthermore, electric arc sources virtually do not allow for depositing coatings on the basis of relatively fusible materials such as, for example, aluminium and others, in whose flux a great amount of particulates is present. In particular, in producing ceramic coatings based on Al2O3, the presence of Al particulates disturbs insulation properties of coatings. This is also the case with depositing diamond-like coatings using a carbon cathode where particulates are soot parts.

In order to reduce the number of particulates in the plasma flux, various methods are employed. The first group of methods comprises using different magnetic and electric fields near the cathode surface which permits to increase the rate of arc spots movement over the cathode surface. This results in decreasing the number of generated particulates and in reduction of their sizes. The second group of methods consists in using various plasma flux separating filters. Such devices are placed between the cathode and the substrate to be sprayed so that they pass through the vapour component of the plasma flux while blocking passage of particulates.

The first group electromagnetic methods are essentially simpler to implement as compared to plasma flux separation methods. However, they are not likely to be effective and do not eliminate particulate generation by the arc discharge. The plasma flux retains a considerable quantity of molten metal drops.

Separation methods are based on deflection of vapour ionised plasma component from the rectilinear path. To this end, the plasma flux is imposed with longitudinal magnetic field. In the spacing between two Coulomb collisions, each plasma charged particle moves along the field by a helical path. When the field is uniform, the path axial line virtually coincides with one of lines of force of the field. Electron and ion movement across lines of force of the filed proves feasible only due to Coulomb collisions. At each collision, a particle moves by the distance of the order of Larmor radius. If collisions occur rarely, the particle happens to be as though bound to lines of force of the field. Such plasma is called "magnetised". If the plasma parameter p/λ>1 (p being the medium free run distance and lambda being the medium Larmor radius), the particle can displace by a marked distance across the field only having travelled a very long path along the line of force.

The ionic and electronic plasma components have different "magnetisation". To provide "magnetisation" of the heavy metal plasma ionic component, magnetic fields up to several dozens of kiloErsted are required. Providing such magnetic fields requires very large and complex systems. Therefore, in practice systems are used which ensure "magnetisation" of only the electronic component. Due to this electrons can freely move only along lines of force of the field while the field by itself does not markedly affect ion movement. In this case electrons will be tied to lines of force of magnetic field while ions will be retained in the same space region by electric field created by the electronic component. In addition, electron magnetisation and dramatic decrease of transverse plasma electronic component mobility allow to provide electric field perpendicular to magnetic one which results in ions drifting in the desired direction. Thus by creating an appropriate length-uniform magnetic field and a corresponding electric field. it is possible to deflect the plasma flux in the desired direction along magnetic field lines and to transport it onto the substrate positioned outside direct vision of the arc discharge cathode. Particulates do not alter their paths when being exposed to electro-magnetic fields, move by straight paths and do not hit the substrate.

Plasma separation methods are considerably more effective to purify the plasma flux from particulates as compared to the first group of methods. However, existing separators have a very poor throughput and, correspondingly, such systems have low productivity.

Arc discharge material evaporation mechanism is described in multiple works and patents. An example of such early work is the U.S. Pat. No. 484,582 (Edison) disclosing use of vacuum arc evaporation to produce a coated substrate. U.S. Pat. No. 2,972,695 (Wroe); U.S. Pat. No. 3,783,231 (Sablev et al.); U.S. Pat. No. 3,793,179 (Sablev et al.) disclose examples of units using magnetic field and specially configured electrodes to stabilise vacuum arc on the electrode working surface, increase evaporation rate and direct the plasma flux on the substrate.

Examples of the first group methods to reduce particulate generation from cathodic surface are taught in U.S. Pat. No. 4,673,477 (Ramalingam et al.); U.S. Pat. No. 4,724,058 (Morrison, Jr.); U.S. Pat. No. 4,849,058 (Veltrop et al.) which use magnetic field to control cathode spot movement by special paths and to increase their movement speed. U.S. Pat. No. 5,269,898 (Welty) also demonstrates that introduction of magnetic field axial component on a long cylindrical cathode results in acceleration of arc movement and in lessening of particulate generation.

Use of methods of plasma separation from particulates is described in U.S. Pat. No. 4,452,686 (Aksenov et al.); U.S. Pat. No. 5,282,944 (Sanders et al.); U.S. Pat. No. 5,279,723 (Falabella et al.); U.S. Pat. No. 5,480,572 (Welty); Aksenov at al., "Transport of Plasma Streams in a Curvilinear Plasma-optics System", Soviet Journal of Plasma Physics 4 (4), 1978.

U.S. Pat. No. 4,452,686 discloses a plasma separator of the "magnetic island" type. It is formed as a cylindrical tube having at one end thereof an arc plasma source. At the exterior side there is a solenoid that provides longitudinal magnetic fields within the tube. At the centre of the tube there is disposed a solenoid that blocks direct vision from cathode to substrate. The exterior and interior solenoids configure magnetic field such that lines of force extend through the tube and go round the interior solenoid passing between the solenoid and the tube walls. Plasma emitted by the source is deflected by magnetic and electric fields and is directed between the tube walls and the central solenoid. Particulates are not deflected by magnetic and electric fields and are deposited on the central solenoid. According to the authors, transmission coefficient of such separator is about 10%.

U.S. Pat. No. 5,282,944 discloses an arrangement operating on the principle close to the preceding one. The cathode is a cylinder co-axial with the exterior tube and having the exterior surface as the working surface. In this case, plasma is emitted in a radial direction toward the tube walls and, assisted by exterior magnetic field, turns by 90 degrees and moves to the outlet of the tube where a substrate is disposed.

The above reference, Aksenov et al., "Transport of Plasma Streams in a Curvilinear Plasma-optics System", describes a curvilinear plasma separator. Plasma generated by a standard electric arc source moves to a plasmaguide formed as a quarter of torus. Longitudinal magnetic field is provided within the plasmaguide using solenoids encircling the plasmaguide. Voltage creating radial electric field is applied to the plasmaguide body. Plasma emitted by the source is transported along lines of force of magnetic field across the plasmaguide. Particulates move rectilinearly and are deposited on the plasmaguide walls.

U.S. Pat. No. 5,279,723 teaches an apparatus similar to the preceding one using a plasmaguide with an angle of 45 degrees. In order to reduce particulate reflection from the plasmaguide walls, a special grid is used on inner plasmaguide walls.

U.S. Pat. No. 5,480,572 discloses a curvilinear plasma separator having a rectangular long cathode operating by the similar principle for a planar plasma source with a rectangular long cathode. Devices are described providing special-shape magnetic field which ensures arc movement along the long rectangular cathode and transporting a flat wide beam over the curvilinear plasmaguide.

All the above-discussed plasma sources with stream separation have not found any noticeable industrial application since they have comparatively low coefficient of plasma-forming material use and low productivity. This is caused by several factors.

In the above references magnetic fields were used whose structure is different in the cathode region (area of magnetic fields responsible for controlling cathodic spot movement over the cathode surface) and in the plasmaguide (where magnetic fields are responsible for transporting plasma flux). This results in the emitted plasma flux passing through the non-uniform magnetic field region prior to coming to the uniform magnetic field region in the plasmaguide. Thus in the above-mentioned reference, Aksenov et al., "Transport of Plasma Streams in a Curvilinear Plasma-optics System", the plasma steam was provided in a standard electric arc source and before reaching the region of uniform longitudinal magnetic field in toroidal plasmaguide, passed at the plasmaguide entrance through the region of attenuated divergent magnetic field having a transverse radial constituent. In U.S. Pat. No 5,480,572, magnetic field was created near the rectangular cathode having a constituent parallel to the cathode surface which provided cathode spot movement along the cathode surface. Thus in the references considered above, the plasma flux passes through the transverse magnetic field region. Because particle mobility in magnetised plasma transverse to magnetic field is limited, a so-called "magnetic plug" occurs. Further, when applying voltage to the plasmaguide body in order to provide ion drift from the walls in the transverse magnetic field region, an electric field longitudinal component appears which slows down ions (see the effect description in Aksenov et al., "Transport of Plasma ..."). The "magnetic plug" and electrostatic barrier at the plasmaguide entrance lead to great losses of plasma flux density. Another reason of low effectiveness of the above sources is a low electron density within plasmaguide. When arc discharge burns between the cathode and the anode positioned at the plasmaguide entrance, the region of high electron density concentrates also near the plasmaguide entrance. As noted previously, in plasma only electrons are "tied" to lines of force of magnetic field while ions are retained in this region by electric field created by the electronic component. When electron density is rather low, this field is rather weak and does not prevent ion drifting across lines of force of magnetic field and ion deposition on the plasmaguide walls. Furthermore, high electron density concentrated at the plasmaguide entrance provides ion-decelerating electric field. These factors result in low plasmaguide conductivity.

Low efficiency of plasma sources with flux separation is also caused by the effect of flux dissipation on gas particles (of residual or reaction gas) within the plasmaguide. If in electric arc sources without flux separation the distance from the cathode to the substrate to be sputtered usually is from 10 to 30 cm, using separators increases this distance to several metres. Plasma ion flux, having travelled such distance, neutralises, dissipates and loses its energy and movement direction as a result of dissipation on gas particles.

The above reasons determine low throughput of plasmaguides and, accordingly, low effectiveness of existing sources of separated electric arc plasma.

Problems arising from the use of the method of coating employing electric arc plasma sources both with and without flux separation include the following. As noted previously, a distinctive feature of electric arc plasma production method is high ionisation level of material emitted from the cathode. However, here ionisation level of reaction gas being introduced in the vacuum chamber is not high. This results in bombardment of the target surface by practically metal ions in the process of ionic cleaning. In the presence of accelerating voltages used in ionic cleaning, dissipation coefficient of the substrate by cathode material ions is generally less then one. Therefore, during ionic bombardment, the coating deposition process occurs alongside substrate dissipation. The deposition process, on one hand, reduces effectiveness of target surface cleaning from impurities and, on the other hand, a coating corresponding to the cathode material is formed. Thus between the target surface and the working coating a sub-layer of material is formed corresponding to the cathode material. This results both in lower working surface adhesion to the substrate and in deterioration of its operating properties.

Moreover, a low ionisation level of reaction gas limits possibilities to use the electric arc deposition method, to provide coatings with pre-determined, target-oriented properties, lowers possibilities to check and control energy of reaction gas atoms, reduces their reactivity in forming compositions both with cathode material particles and with the substrate material.

These disadvantages could be eliminated when producing a flux of gas-metallic plasma having a high ionisation level of both metallic and gaseous components.

Thus, despite existing designs of electric arc separated plasma sources, the need exists to provide a high-performance method for producing a flux of electric arc separated plasma and to develop a source with higher productivity forming a flux of controlled gas-metallic plasma with a high ionisation level of both metal and gas ions. Such source would further promote the method for electric arc coating production and would broaden the area of its technological applications both in industry and in scientific development studies.

SUMMARY OF THE INVENTION

One of the object of the present invention is a method for providing electric arc plasma consisting in producing plasma using a vacuum electric arc discharge on a cold cathode with passing it through a curvilinear plasmaguide, wherein electric arc plasma is provided within the curvilinear plasmaguide and electric current is put through it in a longitudinal direction forming longitudinal magnetic field and electric field, continuous and uniform over the entire plasmaguide length between the cathode and the anode and directed toward or away from the plasmaguide walls.

In one preferable embodiment of the method the curvilinear plasmaguide is made as a toroid portion having a turn angle $\alpha = \text{ArcCos}(2r^2 - R^2)/R^2$, where r and R are, respectively, the small and large toroid radii and the cathode is positioned within the plasmaguide with displacement from the plasmaguide longitudinal axis to its wall with a lesser radius so that the cathode working surface centre is disposed on the radius $Ro = \sqrt{r.R}$ from the plasmaguide centre, the anode being positioned at the plasmaguide exit while the cathode working surface is mounted parallel to the plasmaguide cross-section in the place of cathode installation. In addition, electric current is arc discharge electric current used for plasma generation.

Length-uniform magnetic field is created within the plasmaguide such that magnetic lines of force are perpendicular the cathode working surface and extend through the plasmaguide parallel to its axis. The arc discharge is ignited between the anode and the cathode providing passage of the arc electronic current through the plasma formed within the plasmaguide. A positive or negative potential is applied to the plasmaguide body. Since the plasma electronic component is magnetised, lines of force crossing the cathode and extending adjacent to the plasmaguide axis adopt a potential close to that of the cathode while lines of force adjacent to the plasmaguide walls adopt that of the walls. Thus in magnetised plasma an electric field is created perpendicular to the plasmaguide walls. Electric field provides for additional ion drift from or toward the plasmaguide walls (depending on polarity and magnitude of the applied voltage.)

Due to the presence of magnetic and electric fields the ionised plasma component (see the mechanism described above) is transported along lines of force of magnetic field through the plasmaguide to the exit.

Whereas particulates and the plasma neutral component are deposited on the plasmaguide walls.

The essence of the proposed method consists in the following. First, in providing magnetic field whose lines of force are perpendicular to the cathode working surface and extend continually through the plasmaguide parallel to its axis. In this case, plasma is being emitted by the cathode directly in the area of uniform magnetic field and is being transported through the plasmaguide along length-uniform magnetic field. Parts path over the entire travel extend along lines of force of magnetic field and nowhere cross them. Such magnetic field configuration eliminates occurrence of both "magnetic plug" and electrostatic barrier when applying a potential to the plasmaguide body which is observed in previously described designs.

Second, in putting discharge electric current through plasma emitted into the plasmaguide. Such current in the present case is arc discharge electronic current, the discharge burning between the cathode and the anode disposed at the different ends of the plasmaguide. In this case, high density electronic flux is provided within the plasmaguide. As noted before, the presence of magnetic field results in electrons being able to move only along lines of force of magnetic field and virtually do not travel to the plasmaguide walls. The charge of such electrons concentrated along the plasmaguide axis creates electric field which retains ions within the same space area and prevents their travel to the plasmaguide walls.

In addition, directed electron movement results, on one hand, in gas (residual or reaction) ionisation within the plasmaguide and, on the other hand, in ion acceleration in the given direction. Gas ionisation within the plasmaguide results in lessening energy losses of ions emitted by the arc discharge caused by dissipation on gas particles while ion acceleration results in compensation of these losses.

It should be noted that formed gas ions are also accelerated toward the plasmaguide exit, on one hand, due to directed electron movement and, on the other hand, due to magnetic plasma-dynamic effect occurring at the plasmaguide exit where the plasma flux co-operates with divergent magnetic field having a radial constituent.

Thus at the source exit a gaseous-metallic plasma flux is formed in which both the metallic component generated by the arc discharge and the gaseous component formed due to ionisation of gas within the plasmaguide are strongly ionised. By changing potential on the plasmaguide body and thus increasing or decreasing ion drift toward the plasmaguide walls, it is possible to regulate the ratio of metallic and gaseous ions in the plasma flux. By increasing such potential, when practically all metallic ions arriving to the plasmaguide beginning from the cathode drift toward the walls, it is possible to provide a flux of practically gaseous plasma at the source exit. This flux is formed by those gas particles which have ionised close to the plasmaguide exit and, having accelerated, have reached the exit prior to condensing on the walls due to transverse drift. By setting such a potential that metal ions drift from the plasmaguide wall toward the centre, at the source exit it is possible to produce a gaseous-metallic plasma flux containing both metal and gas (residual or reaction) ions.

Thus these two factors—providing magnetic field with lines of force being perpendicular to the cathode working surface and continuously extending through the plasmaguide parallel to its axis, and putting electronic current through plasma, are caused, on one hand, by a high transmission coefficient of the ionised component of vacuum arc plasma through the plasmaguide and, on the other hand, by gas particle ionisation and acceleration and hence by forming at the exit of the gaseous-metallic plasma flux in which both metallic and gaseous components are highly ionised.

The proposed method is ensured by a high-performance source of arc gaseous-metallic separated plasma with productivity acceptable for industrial use and with enhanced technological possibilities. Not a single reference discussed did disclose magnetic field of the claimed configuration and passing arc discharge electronic current through plasma within the plasmaguide.

Another object of the present invention is an apparatus for producing electric arc plasma in a curvilinear plasmaguide comprising a cathode made of evaporable material, an anode, the curvilinear plasmaguide formed on a torus portion, electromagnetic coil encircling the plasmaguide as well as power sources for the plasmaguide body, arc discharge and electro-magnetic coil, the toroidal plasmaguide being formed with a turn angle of $\alpha=\mathrm{ArcCos}(2r^2-R^2)/R^2$ where r and R are the small and large toroid radii, respectively., the cathode is positioned within the plasmaguide and its working surface is parallel to the plasmaguide cross-section in the place of cathode positioning being biased from the plasmaguide longitudinal axis toward its wall with a smaller radius so that the centre of its working surface is disposed on the radius $Ro=\sqrt{r.R}$ from the toroid centre while the anode is positioned at the plasmaguide exit.

In versions of the apparatus embodiment, the cathode end working surface is made bevelled relative to the cross-section of the plasmaguide entrance with a bevel angle $\gamma=\mathrm{ArcSin}\ l/Ro,$ where l is the distance from the beginning of the plasmaguide toroidal portion to the cathode surface, while the inlet plasmaguide flange on which the cathode is fixed is insulated from the plasmaguide body and the anode is formed as walls of a vacuum chamber disposed at the plasmaguide back or a hot annular electrode placed between the plasmaguide and the vacuum chamber, wherein the electromagnetic coil is wound uniformly over the plasmaguide by the coils number per a length unit and the power source for the plasmaguide body has a positive or negative polarity.

Still another object of the invention is a method for producing a coating on a substrate performed. by the curvilinear plasmaguide using electric arc discharge plasma consisting in ionic cleaning of the substrate surface, saturating this surface with reaction gas and depositing the coating based on the cathode material, wherein electric arc plasma is provided within the curvilinear plasmaguide and electric current is put through it in a longitudinal direction forming longitudinal, continuous and plasmaguide length uniform magnetic and electric fields between the cathode and the anode directed toward or away from the plasmaguide walls, the substrate being mounted from the exit side of the plasmaguide and a potential is applied thereupon, wherein ionic cleaning is carried out in an inert gas medium at a zero or negative potential on the plasmaguide body; substrate surface saturation is performed in a medium of reaction gas or a mixture of reaction and inert gases at a zero or a negative potential on the plasmaguide body, and a positive potential is applied to the plasmaguide body in depositing a coating.

In versions of embodiment of the present method, ionic cleaning is initiated at the zero voltage on the substrate and continuously increase up to the desired value, wherein in saturating the substrate with reaction gas reaction gas atom concentration on the substrate surface is maintained not higher that the solubility limit of said gas in the substrate material; and after the substrate surface saturation with reaction gas short-time ionic cleaning is performed in an inert gas medium.

The source forming the separated gaseous-metallic plasma flux in which both metal and gas components are highly ionised has wider capabilities as compared to currently used electric arc sources and allows for implementing novel technological processes.

First, such apparatus provides the substrate surface etching by cathode sputtering and thereby enables to perform a more effective surface cleaning prior to coating deposition. By using an inert gas as the working gas and setting on the plasmaguide body such a potential that "locks" it for passing metal ions (see above), an inert gas plasma flux is formed at the source exit. Such plasma flux ensures the substrate etching even at low accelerating voltages. This is due to the fact that although at low accelerating voltages the dissipation coefficient is less then one, however, those inert gas ions which have condensed on the surface are being desorbed therefrom and do not form a film as is the case of metal ion bombardment.

Thus the apparatus provides effective cleaning and the substrate surface activation which, in turn, results in enhanced adhesion of subsequently deposited coating. Furthermore, the possibility of carrying out ionic cleaning at low accelerating voltages considerably reduces the likelihood of micro-arcs occurring on the substrate surface thereby reducing its damages.

Using such source, it is possible to create the desired surface micro-profile by the method cathode sputtering etching, for example, using the "mask" technology.

Second, the apparatus ensures producing on the substrate of a near-surface layer saturated with an active gas, for example, of nitrogenised or cementated layer. By setting on the plasmaguide body such a potential which "locks" it for passage of metal ions, and using reaction gas as the working gas, it is possible to produce a reaction gas ionic flux at the source exit. Such gas ions when reaching the surface react with substrate atoms and form the near-surface layer saturated with active gas atoms. Thus the source provides producing on the substrate surface coatings having a sublayer saturated with active gas. Performance of such coatings can be considerably higher than that of coating deposited on the original surface.

Third, a high ionisation level of both metallic and gaseous components and the lack in the flux of a neutral metallic component and of particulates enable to check and control the energy of particles reaching the substrate which increases reactivity in forming compositions both of evaporated material with reaction gas and directly with the substrate material. Good controllability of the plasma flux parameters makes it possible to provide a different complex of coating properties depending on their purpose. In particular, to deposit coatings having high dispersity. High dispersity determines high strength properties of coatings, including great plasticity at high micro-hardness and high compressing stresses.

Thus an advantage of the present invention is providing a highly effective separated gaseous-metallic plasma flux wherein both metallic and gaseous components are highly ionised, with comparatively high coefficient of plasma-forming material use and with great productivity. This leads to the possibility of industrial use of the separated electric arc plasma flux and of implementing novel technological processes.

BRIEF DESCRIPTION OF DRAWINGS

Further, the invention will be disclosed by way of its embodiments with references to accompanying drawings in which.

DESCRIPTION OF THE INVENTION

Figures 1, 2:
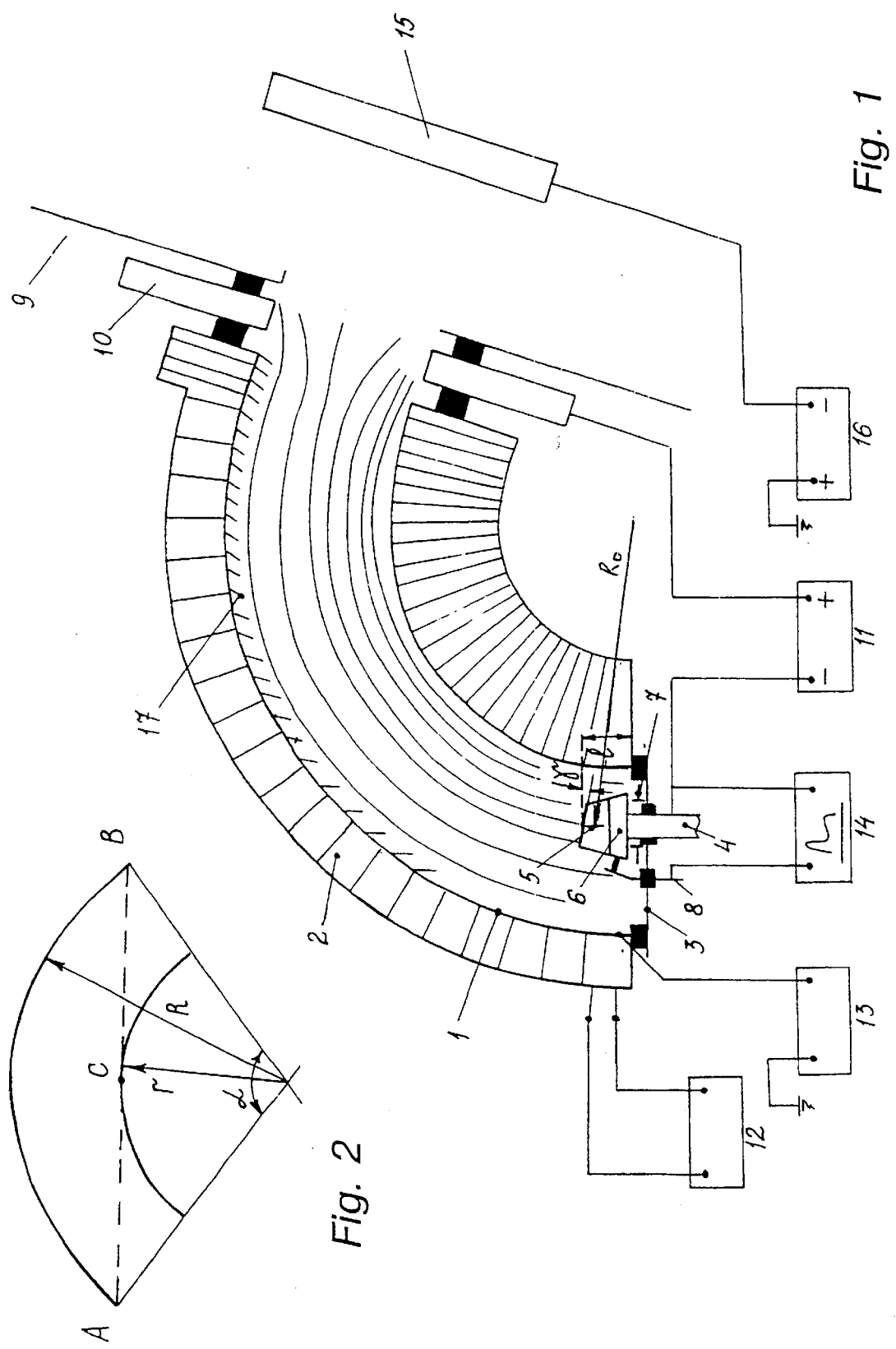
FIG. 1 presents an apparatus for producing plasma according to this invention with its power sources.
FIG. 2 presents an enlarged view of plasmaguide indicating its turn radii.

An apparatus performing plasma production generally consists from a curvilinear plasmaguide with a coil placed thereupon creating magnetic field, a cathode assembly positioned at the plasmaguide entrance, an anode positioned at the plasmaguide exit and en electric supply system. The curvilinear plasmaguide is a toroid portion and is made of non-magnetic material having water-cooled walls. The plasmaguide turn angle is determined on condition of the absence of direct vision of the plasmaguide exit from its entrance, i.e. points A, B and C must be disposed on one straight line (see FIG. 2) and equals $$\alpha = \text{ArcCos}(2r^2 - R^2)/R^2,$$

where $\alpha$ is the turn angle, r is a small and R is a large radii of the plasmaguide walls. The plasmaguide may end with a cylindrical portion as shown in FIG. 1.

The plasmaguide exterior surface has disposed thereupon an electromagnetic coil 2 with the uniform coil number per a length unit.

At the plasmaguide entrance, on a flange 3 a cathode assembly is mounted. The flange is made from a non-magnetic material and may be or may not be electrically insulated from the plasmaguide body. The cathode assembly comprises the following elements:

- a water-cooled cathode holder 4 electrically insulated from the entrance flange;
- a tapered cathode 5 with tapering angle being 8–10 degrees;
- a metal skirt 6 being an extension of the cathode;
- a protective shield 7 mounted on the cathode holder via an insulator and electrically insulated both from the cathode and from the plasmaguide body;
- an igniting electrode 8 with an insulator positioned between the electrode and the skirt 6.

At its other end the plasmaguide is mounted via an insulator to a vacuum chamber 9. Between the plasmaguide and the chamber an insulated electrode 10 may be disposed which may be an arc discharge anode. The power supply system comprises the following sources:

- an arc discharge power source 11 with the negative pole being connected to the cathode and the positive pole being connected to the anode 10 or to the chamber body 9;
- electromagnetic coil power source 12;
- bipolar plasmaguide body power source 13;
- source 14 generating a high voltage pulse for igniting the arc discharge.

The camera of the apparatus contains a substrate 15. Acceleration voltage from a power source 16 may be applied to the substrate.

A removable grid 17 is positioned on the plasmaguide wall by the large radius.

We should note that magnetic field in the torroid-shaped plasmaguide is not radius-uniform and varies proportionately to 1/Ri where Ri is the distance from the toroid centre to a corresponding point within the plasmaguide. In order for the centre of the cathode working surface and the emitted plasma flux to be in an equal position relative to the plasmaguide walls, the cathode must be biased to the wall with a lesser. radius. The cathode bias amount is determined from the condition of equality of magnetic fluxes through sections from the centre of said cathode surface to the wall having a larger radius. It follows from this condition that the cathode surface centre must be positioned relative to the toroid centre on the radius $Ro = \sqrt{r \cdot R}$ where r and R are the small and large plasmaguide wall radii.

In order to ensure. the cathode working surface perpendicularity to lines of force of magnetic field, the cathode end surface is bevelled relative to the cross-section of the plasmaguide entrance. The bevel angle is γ=ArcSin l/Ro where t is the distance from the beginning of the plasmaguide toroidal portion to the cathode surface should be noted that as the cathode wears down the corresponding angle is automatically maintained since the surface wears down perpendicular to lines of force of magnetic field.

The plasma source operates as follows. A voltage is applied to the electro-magnetic coil 2. Continuous longitudinal magnetic field is created within the plasmaguide 1 parallel to the plasmaguide axis and length-uniform. A high-voltage pulse is generated between the igniting electrode and the skirt 6 of the cathode 5 resulting in electric discharge across the insulator surface and an electric spark occurs. The electric spark initiates ignition of the arc discharge between the cathode 5 and the anode 10. A vacuum chamber 9 wall as well as the special electrode -anode 10 may serve as the anode. Because magnetic field is parallel to the plasmoguide 1 axis and perpendicular to the cathode working surface, lines of force form a sharp angle with the cathode 5 side surface. Arc cathodic spots are known to move toward the sharp angle formed by lines of force of magnetic field from the cathode surface. Thus the cathodic spots move from the side surface to the cathode working end surface and are retained there. The skirt 6 being the cathode 5 extension serves for more complete use of the cathode material. In the present design, the cathode may wear down to a thickness on the order of a millimetre. The protective shield 7 serves to protect the cathode holder and from damages in arc running down in the case of emergency operation of the plasma source.

The plasma flux is emitted directly in the uniform magnetic field area and is transported along magnetic lines toward the plasmaguide exit.

In order to level flux density over the radial section, the plasmaguide 1 may end with a cylindrical portion with an electric-magnetic coil providing section-uniform magnetic field.

In order to increase or decrease ion drift from or toward the plasmaguide walls, a positive or negative voltage is applied to the plasmaguide 1 body. To reduce distortion of electric field created by the applied voltage, the plasmaguide entrance flange 3 may be insulated from the walls.

A plasma neutral component and particulates move by straight paths and are. deposited on the plasmaguide walls. To reduce particulate reflection, the grid 17 is mounted to the wall with the large radius. To facilitate servicing and cleaning of the source, the grid 17 is made removable.

After the plasma flux has left the source, it moves onto the substrate 15 to which an accelerating voltage may be applied.

In depositing insulating coatings, e.g. based on $Al_2O_3$, not the chamber 9 wall but the special hot electrode 10 may be employed as the arc discharge anode. The electrode is heated due to arc current and an insulating coating preventing arc discharge burning is not formed thereupon.

Technological process for coating deposition occurs as follows. An inert gas, for example argon, is fed to the vacuum chamber. On the plasmaguide 1 body a zero or negative potential is set so that the plasmaguide is "locked" for cathode material ions. In this case, a gaseous plasma flux is formed at the source entrance. An accelerating voltage is applied to the substrate 15. Plasma ions bombard the substrate surface resulting in its pulverisation. Thus the substrate 15 surface cleaning from impurities and its activation take place. In order to decrease the possibility of forming micro-arcs on the substrate surface, ionic cleaning is started at low accelerating voltages and gradually elevate it to the desired magnitude.

After conducting ionic cleaning, the inert gas is replaced with reaction gas. A reaction gas plasma flux is formed at the source exit. Gas ions reaching the surface diffuse to the near-surface layer of the substrate 15. Here the diffusion process is activated by ionic bombardment. In producing the diffusion sub-layer, such technological parameters are set so that gas ion concentration on the surface does not exceed the solubility limit of this gas in the substrate 15 material. In this case, a gas solid solution is formed in the substrate material and no layer of chemical compositions of gas ions with substrate atoms is formed on the surface which both prevents particle diffusion into the substrate 15 and deteriorates adhesion to the substrate of subsequently deposited coating.

After the process for forming the diffusion layer, generally short-time ionic cleaning is performed with the aim to remove from the surface traces of chemical compositions of reaction gas with the substrate material.

Thereupon a positive potential is set on the plasmaguide body that "opens" the plasmaguide 1 for metal ions. Potential on the substrate 15 is lowered to the desired value. The gaseous-metallic plasma flux arrives on the substrate and condenses forming a coating.

Thus the surface is prepared before depositing the coating and forming the coating with diffusion sub-layer.

The plasma flux cross-section produced in the source is 600 sq.cm. The following results were obtained in etching a substrate of 40x steel when the source operated in the gas plasma mode at the zero potential on the plasmaguide body and using argon gas:

Cathode Gas pressure, mm Hg Voltage on substrate, V Etching rate

| Cathode | Gas pressure, mm Hg | Voltage on substrate, V | Etching rate um/hour |
| --- | --- | --- | --- |
| titanium | $3 \times 10^{-3}$ | 400 | 4 |
| titanium | $6 \times 10^{-3}$ | 500 | 6 |
| molybdenum | $6 \times 10^{-3}$ | 500 | 8 |

Using this etching method with masks (covering a portion of the substrate surface with masks) gas-dynamic grooved were produced on working surfaces of gas-dynamic bearings.

Nitrogen gas was used to saturate the substrate surface with reaction gas. At a nitrogen pressure of $5 \times 10^{-3}$ mm Hg and a voltage on the substrate of 350 V for 20 minutes a nitrogenised coating was produces on 40x steel of a thickness of 60 um and of a thickness of 40 um on P6M5 steel. When nitrogen pressure increases, a nitride layer of doping elements—a "white layer"—begins to form on the substrate surface which both prevents nitrogen from entering the substrate and deteriorates coating adhesion to the substrate. Therefore, after the process of saturating the substrate with nitrogen—nitrogenising—a short-time ionic cleaning was carried out with the aim to etch off the "white layer".

Below are characteristics of titanium nitride coatings produced on the proposed apparatus. For contrast, characteristics of coatings produced on conventional plasma sources are provided.

| Nos. | Feature | Patented source | Conventional source |
|---|---|---|---|
| 1. | Deposition rate, um/hr | up to 40 | up to 3% |
| 2. | Micro-asperity size, um | practically repeats substrate relief (<0.02) | 0.3–0.6 |
| 3. | Dispersion column crystallite size, um | 0.1–0.3 | 1.0–2.0 |
| 4. | Palmqvist density, $N/m^{-6}$ | 150 | 25 |
| 5. | Micro-hardness H0.5, GPa | 32–37 | 25 |
| 6. | Residual stresses, MPa | −3000–35000 | −1700 |
| 7. | Coating continuity | practically non-porous | inclusions |

A special feature of coating structure deposited using the patented source is its high dispersity. Dispersity and lack of particulates determine high strength properties of coatings, in particular, great plasticity at high micro-hardness and great compressing stresses. Substrate etching before coating deposition ensures high adhesion between the coating and the substrate. Moreover, the coating is virtually non-porous.

Aluminium-based coatings of AlN and $Al_2O_3$ type were produced on the proposed source. The coatings are good dielectrics with uniform structure and having no heterogeneous inclusions.

Furthermore, using several sources both multi-layer systems of TiN(C)—$Al_2O_3$—TiN(C) type and composition coatings of (Zr—Al)N, (Mo—Al)N, (Zr—Mo)N type were produced. It should be noted that it is not possible to produce either type of coatings on conventional sources.

Depositing coatings on high-precision and sharply whetted and small-size tools has shown that the coating in practice does not change the tool geometry and does not disturb whetting of its edges. It should be noted that the presence of particulates in conventional sources plasma streams makes it practically impossible for coatings to be deposited on such tools. Depositing coatings on machine parts having high grade of surface cleanness, in particular, fuel pump plunger, has enabled to increase 6-fold their service life without deteriorating operating performance.

Testing tools having combined layers—diffusion layer (nitrogenised)+coating (titanium nitride)—has demonstrated that such layers have wear-resistance 2–3 times higher than with similar coatings without-diffusion sublayer.

Coatings produced on the patented source have high anti-corrosion resistance. No traces of corrosion were discovered after titanium nitride coatings testing in environmental chambers in sea air medium and in saline solutions. It should be noted that coatings produced on conventional sources have pores and corrode in wet air environment.

Using high-strength graphite cathode on patented source diamond-like coatings with a thickness of 1.2 um were produced. Tests have shown high effectiveness of such film in protecting part surfaces from environmental effects, in particular, in protecting beryllium part surfaces.

Thus the proposed source forms a separated electric arc gaseous-metallic plasma flux with a high ionisation level of metallic and gaseous components, has high productivity and broader technologic capabilities as compared with existing electric arc plasma sources.

What is claimed is:

1. A method for providing electric arc separated plasma, comprising the steps of:

producing plasma by using vacuum electric arc discharge on a cold cathode, passing said plasma through a curvilinear plasmaguide, creating electric arc plasma within the curvilinear plasmaguide, putting electric current through said curvilinear plasmaguide in a longitudinal direction, forming longitudinal magnetic and traverse electric fields, continuous and uniform along a plasmaguide length between said cathode and an anode, directing the electric fields toward or away from plasmaguide walls of said plasmaguide, performing ionic cleaning in an inert gas medium at a zero or a negative potential on a plasmaguide body and a voltage on the substrate positioned at a plasmaguide exit side, saturating the substrate surface at potentials in a medium of reaction gas or a mixture of reaction gas and inert gas, applying a positive potential while depositing coating on the plasmaguide wall surfaces, and wherein after the substrate surface has been saturated with reaction gas, ionic cleaning is carried out in inert gas medium.

2. The method as claimed in claim 1, wherein the plasmaguide is made as a toroid portion having a turn angle $\alpha=\mathrm{ArcCos}(2r^2-R^2)/R^2$, where r and R are, respectively, small and large toroid radii while the cathode is displaced relative to the longitudinal axis of the plasmaguide wall with a less radius so that a centre of a working surface of the cathode is disposed on a radius $Ro=\sqrt{r\times R}$ from a plasmaguide centre, where r and R are, respectively, a small and large toroid radii, wherein the anode is positioned at a plasmaguide exit while the cathode working surface is positioned parallel to a plasmaguide cross-section at a place of cathode positioning.

3. The method as claimed in claim 1, wherein electric current is arc discharge electronic current, the discharge being used for plasma generation.

4. An apparatus for producing an electric arc separated plasma flux comprising:

a cold cathode made of evaporable material, an anode, a curvilinear plasmaguide shaped as a toroid portion, an electric magnetic coil encircling the plasmaguide, power sources for energising a plasmaguide body, arc discharge and electromagnetic coil, a toroidal plasmaguide made with a turn angle $$\alpha=\mathrm{ArcCos}(2r^2-R^2)/R^2,$$

where r and R are, respectively, a small and large toroid radii, the cathode being disposed within the plasmaguide and a working surface of said cathode is parallel to a cross-section of the plasmaguide in a place of said cathode positioning biased from a plasmaguide longitudinal axis and toward a wall of said plasmaguide with a lesser radius so that a centre of said working surface of said cathode is disposed on a radius $Ro=\sqrt{r\times R}$ away from a toroid centre, where r and R are, respectively, a small and large toroid radii, the anode being disposed at an exit of the plasmaguide, a substrate surface being saturated with reaction gas, with a coating based on a cathode material being deposited, said curvilinear plasmaguide creating electric arc plasma within, and putting electric current through said plasma in a longitudinal direction for forming longitudinal magnetic and electric fields, continuous and uniform over a plasmaguide length of said plasmaguide between said cathode and said anode, the fields being directed toward or away from plasmaguide walls with ionic cleaning being preformed in an inert gas medium at a zero or a negative potential on said plasmaguide body of said plasmaguide and a voltage on the substrate positioned at an exit side of said plasmaguide, the substrate surface being saturated at potentials in a medium of reaction gas or a mixture of reaction gas and inert gas, with a positive, potential being applied when depositing said coating on the substrate surface of said plasmaguide; and wherein after the substrate surface has been saturated with reaction gas, ionic cleaning is carried out in inert gas medium.

5. The apparatus as claimed in claim 4, wherein an end of said working surface of the cathode is bevelled relative to a cross-section of an entrance of the plasmaguide with a bevel angle $$\gamma = ArcSin\ e/Ro,$$

where e is a distance from a beginning of a plasmaguide toroid portion to the cathode working surface while a flange of the plasmaguide entrance on which the cathode is fixed is insulated from the plasmaguide body.

6. The apparatus as claimed in claim 4, wherein the coil is wound over the plasmaguide uniformly by coil counts per a unit length, while one of said power sources of the plasmaguide body has a positive or a negative polarity.

7. The apparatus as claimed in claim 4, wherein the electromagnetic coil is wound over the plasmaguide uniformly by coil counts per a unit length, while one of said power sources of the plasmaguide body has a positive or a negative polarity.

8. A method of producing a coating on a substrate using an electric arc plasma ionic cleaning of substrate surface, comprising the steps of:

saturating said surface with reaction gas, depositing a coating based on a cathode material, creating electric arc plasma within a curvilinear plasmaguide, putting electric current through said plasma in a longitudinal direction, forming longitudinal magnetic and electric fields, continuous and uniform over a plasmaguide length between a cathode and an anode, directing the fields toward or away from plasmaguide walls, performing ionic cleaning in an inert gas medium at a zero or a negative potential on a plasmaguide body and a voltage on the substrate positioned at a plasmaguide exit side, saturating the substrate surface at potentials in a medium of reaction gas or a mixture of reaction gas and inert gas, applying a positive potential while depositing coating on the plasmaguide wall surfaces, and wherein after the substrate surface has been saturated with reaction gas, ionic cleaning is carried out in inert gas medium.

9. The method as claimed in claim 8, wherein the plasmaguide is shaped as a toroid portion with a turn angle $\alpha = Arc\ Cos(2r^2 - R^2)/R^2$ where r and R are, respectively, a small and large toroid radii, while the cathode is disposed within the plasmaguide with a bias from a plasmaguide longitudinal axis toward its wall with a lesser radius so that a centre of a working surface of said cathode is disposed on a radius $Ro = \sqrt{r \times R}$ away from a centre of the plasmaguide, where r and R are, respectively, a small and large toroid radii, the anode is disposed at an exit of the plasmaguide while the cathode working surface is positioned parallel to a cross-section of the plasmaguide in a place of cathode positioning.

10. The method as claimed in claim 8, wherein ionic cleaning is initiated at a zero voltage across the substrate and voltage is continuously elevated up to a desired magnitude.

11. The method as claimed in claim 8, wherein saturating the substrate with reaction gas, reaction gas atom concentration on the substrate surface is maintained not higher than a solubility limit of said gas in the substrate material.

* * * * *